United States Patent [19]

Simko

[11] 4,099,196
[45] Jul. 4, 1978

[54] TRIPLE LAYER POLYSILICON CELL
[75] Inventor: Richard T. Simko, Los Altos, Calif.
[73] Assignee: Intel Corporation, Santa Clara, Calif.
[21] Appl. No.: 810,912
[22] Filed: Jun. 29, 1977
[51] Int. Cl.² ............................................ H01L 29/27
[52] U.S. Cl. ...................................... 357/23; 357/41; 357/59; 307/304; 307/238; 365/185
[58] Field of Search ........................... 357/23, 41, 59; 365/185; 307/304, 238

[56] References Cited
U.S. PATENT DOCUMENTS

| | | | |
|---|---|---|---|
| 3,500,142 | 3/1970 | Kahng | 317/235 |
| 3,660,819 | 5/1972 | Frohman-Bentchkonsky | 317/235 R |
| 3,797,000 | 3/1974 | Augusta | 340/173 R |
| 3,825,945 | 7/1974 | Masuoka | 357/23 |
| 3,825,946 | 7/1974 | Frohman-Bentchkonsky | 357/23 |
| 3,868,187 | 2/1975 | Masuoka | 357/23 |
| 3,906,296 | 9/1975 | Maserjian | 357/7 |
| 3,919,711 | 11/1975 | Chou | 357/23 |
| 3,984,822 | 10/1976 | Simko | 340/173 R |
| 3,996,657 | 12/1976 | Simko | 29/571 |
| 4,016,588 | 4/1977 | Ohya | 357/23 |

Primary Examiner—Martin H. Edlow
Attorney, Agent, or Firm—Blakely, Sokoloff, Taylor & Zafman

[57] ABSTRACT

A triple layer polysilicon cell for use in an electrically erasable PROM or for a discretionary circuit connector is described. Tunneling is employed to transfer charge to a floating gate from a programming gate and also to transfer charge from the floating gate to an erasing gate. Through light doping steps, the first layer of polysilicon (programming gate) and a second layer of polysilicon (floating gate) include rough surfaces. These rough surfaces provide enhanced electric fields which allow tunneling through relatively thick oxides.

12 Claims, 5 Drawing Figures

4,099,196

TRIPLE LAYER POLYSILICON CELL

BACKGROUND OF THE INVENTION:

1. Field of the Invention

The invention relates to the field of MOS floating gate devices.

2. Prior Art

In recent years, numerous metal-oxide-semiconductor (MOS) cells have been developed which employ floating gates for the storage of information. Typically, electrical charge is transferred into an electrically isolated (floating) gate to represent one binary state while an uncharged gate represents the other binary state.

Perhaps the first of these floating gate devices is disclosed in U.S. Pat. No. 3,500,142. In this device tunneling is employed to transfer charge from the substrate into a floating gate through a relatively thin oxide (50 A). Because of the difficulty in fabricating the thin oxide, this device has not been commercially successful. Moreover, because of the thin oxide only relatively short storage times were obtained.

Avalanche injection has also been used to transfer charge from the substrate into a floating gate. This phenomenon allows the use of relatively thick oxides (500 to 1,000 A) and results in long retention times (years). An MOS floating gate device employing avalanche injection for programming is described in U.S. Pat. No. 3,660,819. Channel injection again through a relatively thick oxide, is also used to charge floating gates. For an example of this type of device, see U.S. Pat. No. 3,966,657.

Numerous erasable MOS floating gate devices have been described in the prior art, however, currently the most commonly employed erasing technique for floating gate devices is the exposure of the devices to radiation such as ultraviolet radiation. A device is described in U.S. Pat. No. 3,797,000 which employs avalanche injection for the removal of charge from a floating gate.

In copending application Ser. No. 778,574, filed Mar. 17, 1977 (assigned to the assignee of this application) a floating gate device is described which employs channel injection for charging a floating gate and tunneling for discharging or erasing this gate. Tunneling through a relatively thick oxide from the floating gate is possible with this device since an enhanced electric field is produced by the rough surface on the floating gate.

In the present invention an MOS cell is described which employs tunneling both for charging a floating gate and for the removal of charge from this gate. Enhanced electric fields which result from rough textured gates allow the charging and discharging of the floating gate through relatively thick oxides. In the presently preferred embodiment, the invented device is fabricated from three separate layers of polycrystalline silicon (polysilicon). One application for such a device other than for use in an electrically programmable and electrically erasable read-only memory is for providing discretionary connections. For example, the described device may be used for coupling a redundant row or column in a memory to replace a failed row or column. The invented device is particularly suitable for use with a charge-couple device (CCD) which employs three levels of polysilicon such as the one described in copending application Ser. No. 764,005, filed Jan. 31, 1977 (assigned to the assignee of this application).

SUMMARY OF THE INVENTION

An MOS cell fabricated on a silicon substrate from three layers of polysilicon is described. A first gate which is insulated from the substrate is formed from the first layer of silicon. A floating gate or second gate which is insulated both from the substrate and from the first gate is formed from a second layer of silicon; this gate overlaps at least a portion of the first gate. A third gate or control gate which is insulated from the other gates is formed from a third layer of polysilicon and overlaps at least a portion of the second gate. A fourth gate is employed which is also fabricated from the third layer of polysilicon; this gate overlaps at least a portion of the silicon gate. By the application of a potential between the first gate and the third gate, charge may be tunneled into the second gate. By the application of a potential between the third gate and the fourth gate, charge may be tunneled into the third gate from the second gate.

DETAILED DESCRIPTION OF THE INVENTION:

A metal-oxide-semiconductor (MOS) cell fabricated on a silicon substrate is described. The cell includes a floating gate which may be electrically charged and electrically erased, and thus provides storage. The described cell may be employed in a memory array or as a discretionary circuit connector in other circuits. In the presently preferred embodiment, the cell is fabricated from three separate layers of polycrystalline silicon (polysilicon) by employing knoen photofabrication techniques.

In the following description well-known processing steps needed to fabricate the cell are not described in detail since they would obscure the invention in unnecessary detail. In certain instances, however, specific details such as conductivity types, temperatures, etc. are provided in order that the invention may be thoroughly understood. It will be obvious to one of ordinary skill in the art that the invention may be employed without use of these specific details.

While different processes may be employed to fabricate the invented device, in the presently preferred embodiment, a standard oxide isolation, n-channel MOS process is employed which results in threshold voltages for field-effect transistors of approximately 0.7 volts. As will be apparent because of the programming and erasing voltages, the field oxide threshold should be at least 25 volts.

Figure 1:
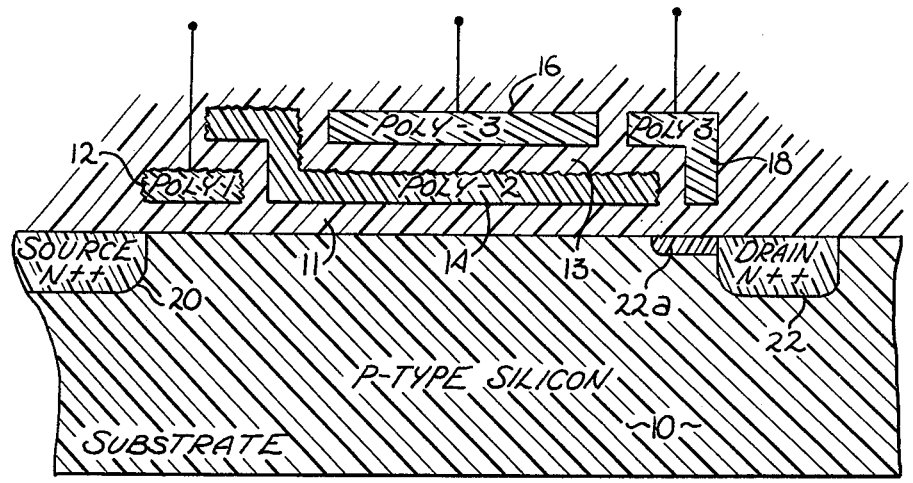
FIG. 1 is a cross-sectional, elevation view of a substrate which includes a device fabricated in accordance with the present invention.

Referring now to FIG. 1 and the p-type silicon substrate 10, the device of the present invention includes an n-type source region 20 and an n-type drain region 22 which define a channel. Four separate gates, each of which are fabricated from polysilicon, are formed on the substrate generally above the channel. A first gate 12 (program/select gate) is separated from the substrate by an oxide (SiO$_2$) layer 11 of approximately 1,000A. A second gate 14 (floating gate) is electrically isolated and insulated from the substrate and the first gate 12 by approximately 1,000A of oxide. A portion of the gate 14 overlaps the first gate. A third gate 16 (control gate) is fabricated above the second gate 14 and insulated from this gate by approximately 1,000A of oxide. A fourth gate 18 (erase gate) is insulated from the other gates and the substrate; a portion of this gate overlaps the floating gate 14. Gate 18 is separated from the floating gate 14 and the gate 16 by approximately 1,000A of oxide.

The relatively thick oxides separating the gates are easy to fabricate, and importantly, because of the thickness (and quality) of the oxides, charge remains on the floating gate for long periods (i.e. years). The oxides used to insulate the gates from one another and from the substrate may be a single HCL grown oxide formed at 1,000° C or a double grown (in dry O$_2$) oxide.

As presently fabricated, first a gate oxide layer 11 is formed on the substrate 10. Then a first layer of polysilicon is formed on this oxide and etched, employing well-known photolithographic techniques, to form the first gate 12. After an oxide is regrown on the substrate, a second layer of polysilicon is formed on the substrate and etched again employing well-known processes to form the second gate 14. As is readily seen in FIG. 1 and as mentioned, a portion of this floating gate overlaps gate 12. Following this another layer 13 of oxide is formed over the substrate, including the remaining portions of the first and second polysilicon layers; then a third layer of polysilicon is formed over the oxide 13. This third layer of polysilicon is etched again with well-known processes, to form the gates 16 and 18.

The source and drain regions 20 and 22 are formed in an ordinary doping step in alignment with the gates 12 and 18. Prior to the formation of the third layer of polysilicon, the n-type region 22a is formed in the substrate during a predeposition step. The region 22a permits conduction in the channel without the application of a positive potential to gate 18.

Relatively light phosphorous predeposition steps are employed for each of the first and second polysilicon layers before these layers are covered with oxides. This predeposition in the presently preferred embodiment, occurs at 775° C to obtain a V/I of approximately 50 to 100 ohms. The reason for this relatively light predeposition is that it makes possible tunneling through the relatively thick oxide as shall be discussed later.

As is shown by the relative size of the floating gate 14 and the control gate 16 in FIG. 1, substantial capacitance coupling exists between these two gates. This coupling is substantially greater than the coupling between the floating gate and either the program/select or erase gates. The overlapping areas of the floating gate and the control gate are selected to provide this coupling. By way of example, when the control gate 16 is grounded and 25 volts is applied to the gate 18, the large capacitance between gates 14 and 16 causes a substantial portion (approximately 20 volts of the 25 volts) to appear between the gates 14 and 18 since the floating gate is held close to the potential on gate 16 by this large capacitance.

Due to the relatively light predeposition steps employed with the first and second gates, the upper surfaces and edges of these gates include substantial random undulations after the polysilicon is oxidized at approximately 1000° C. The rough texture of gates 12 and 14 is shown graphically in FIG. 1 (and for corresponding gates in FIG. 3) by the ragged lines defining the upper surfaces and edges of these structures. The upper surfaces and edges of gates 12 and 14 include curves with radii of curvature of approximately 50A (ranging from 25A to 75A). These rough surfaces and edges, as will be explained, are very important since they provide enhanced electric fields. For additional information concerning the rough textured surfaces on the gates see copending application Ser. No. 778,574, filed Mar. 17, 1977 and assigned to the assignee of this application. This copending application includes photographs taken with a scanning electron microscope of a gate with a rough surface.

To program the device of FIG. 1, that is to electrically charge the floating gate 14, a potential of approximately 25 volts (D.C. or pulse train) is applied to the control gate 16 and to the erase gate 18. (The erase gate may be grounded, however, it is easier to program the device with the erase gate at 25 volts). The program 12 is held at 0 volts. Because of the relatively large coupling capacitance between gates 14 and 16, the floating gate 14 rises in potential close to the 25 volts (i.e. 20 volts). The resultant electric field between gates 12 and 14, at first examination, does not appear to be sufficient to cause electrons to tunnel through the approximately 1,000A of oxide separating these gates. However, because of the enhancement of the electric field caused by the undulating surface of gates 12, electrons are able to tunnel through the oxide at the regions of the enhanced fields. Once charge has been tunneled into the floating gate 14 it remains isolated on this gate.

The threshold voltage of a newly fabricated device (neutral floating gate) is approximately 0.7 volts. The floating gates of these devices in use are either positively charged (lack of electrons) or negatively charged. With a negative charge on the floating gate 14, the threshold voltage of the device of FIG. 1 is approximately 10 volts. The threshold voltage with a positively charge gate is approximately $-10$ volts.

To remove electrons from the floating gate 14, they are tunneled from the floating gate to the erase gate 18 leaving the gate 18 with a net positive charge. This is accomplished by grounding the control gate 16 and the program/select gate 12 and by applying a potential of approximately 25 volts (D.C. or pulse train) to the erase gate 18. Because of the rough surface of gate 14, the resultant enhanced electric field provides sufficient energy to tunnel electrons through the approximately 1,000A of oxide separating these gates.

Figure 2:
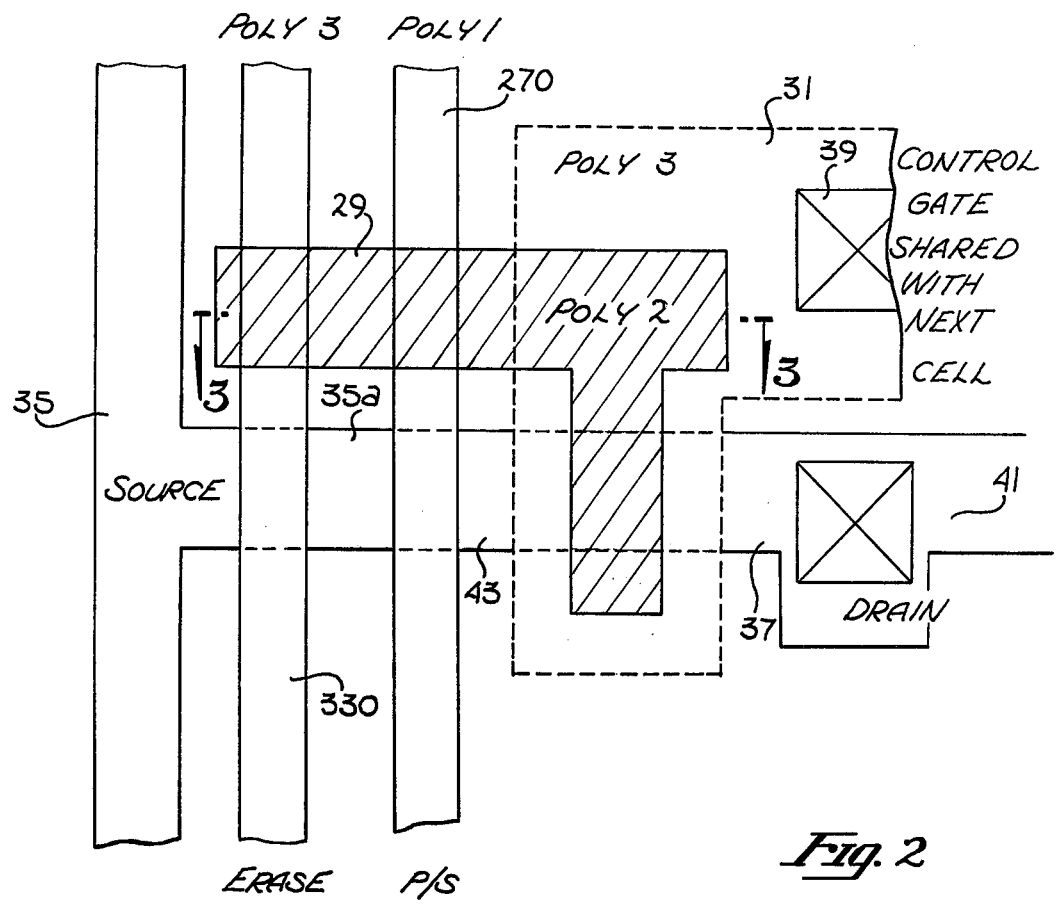
FIG. 2 is a plan view of an alternate embodiment of the device of FIG. 1.
Figure 3:
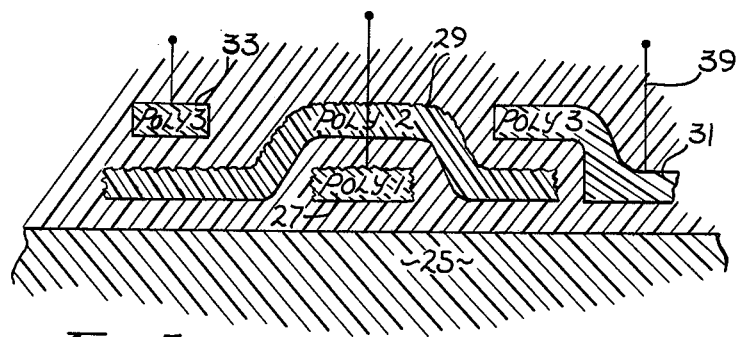
FIG. 3 is a cross-sectional, elevation view of the device of FIG. 2 taken generally through section line 3—3 of FIG. 2.

In FIGS. 2 and 3, a preferred layout of the device of FIG. 1 is shown when this device is used as a memory cell in a memory array. The cell of FIGS. 2 and 3 requires approximately 2.15 mils$^2$ of area. The embodiment of FIGS. 2 and 3 again include four separate gates fabricated from three layers of polysilicon, however, the arrangement of the gates is somewhat different. First referring to FIG. 3, a first (program/select) gate 27 which is similar to gate 12 of FIG. 1 is fabricated from a first layer of polysilicon on the substrate 25. The second gate which is the floating gate 29 is fabricated from the second layer of polysilicon and overlaps the first gate. The third polysilicon layer is used to fabricate the erase gate 33 and the control gate 31. The control gate 31 for this embodiment as is more readily seen in FIG. 2, extends laterally to overlap the floating gate of an adjacent cell, thus this control gate is shared by two adjacent cells.

In FIG. 2, the layout of this cell in an array may more readily be seen. First there is an elongated source line 35 which comprises a diffusion in the substrate. This diffusion forms the source regions for a plurality of cells. A portion of this line which extends transverse to the line is shown as region 35a. This region extends from line 35 into alignment with the elongated polysilicon strip 270. Note, the portion of region 35a below the polysilicon strip 330 is diffused prior to the formation of the third layer of polysilicon. A channel extends between the source region 35a and the drain region 37. A portion of this channel shown as region 43 is diffused with an n-type dopant, in alignment with the line 270 and the control gate 31.

The elongated polysilicon strip 330 defines a plurality of erase gates such as the gate 33 of FIG. 3. Similarly, the elongated polysilicon line 270 defines a plurality of program/select (P/S) gates such as gate 27 of FIG. 3. These elongated spaced-apart lines are fabricated generally parallel to the source line 35. The floating gate 39 is a generally L-shaped member having a section which extends over the channel and another section which extends over the polysilicon line 270 and under the polysilicon line 330. A substantial portion of this floating gate is under the control gate 31 to provide the "tight" capacitive coupling between these two members as discussed in conjunction with FIG. 1. The control gate 31 extends over the channel between the source and drain regions and as mentioned, extends laterally to an adjacent cell.

When the cell of FIGS. 2 and 3 is fabricated in an array each cell is coupled to a pair of metal lines which are disposed generally transverse to the lines 330 and 270. One of these metal lines is coupled to the control gates such as control gate 31 through a contact 39. A second metal line parallel to this first metal line is coupled to the drain regions such as drain region 37 through contact 41. This line is a sensing line used to sense whether or not the floating gate is charged.

The cell of FIGS. 2 and 3 is programmed and erased in the same manner as the cell of FIG. 1. Moreover, as in the case of the device of FIG. 1, the polysilicon layers used to fabricate the program/select gate 27 (line 270) and the floating gate 29 include rough, undulating surfaces which provide enhanced electric fields. As was the case with the cell of FIG. 1, all the gates are insulated one from the other by oxide layers of approximately 1,000A and an oxide layer of approximately 1,000A is grown on the substrate before fabricating the gates.

Figure 4:
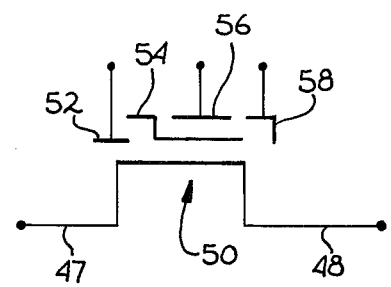
FIG. 4 is a schematic symbol for the device of the present invention.

In FIG. 4 a symbol is shown which is used to describe the invented cell when coupled in an array. The source, drain and channel regions are shown in a conventional manner for a field-effect device as terminals 47 and 48 for the source and drain terminals and region 50 for the channel. The floating gate 54 is shown as an electrically isolated member. A control gate 56 with a connecting line is illustrated above the floating gate 54 to designate this gate. A shorter gate 52 which is the program/select gate is shown under one edge of the floating gate 54. The erase gate 58 is shown overlapping the other end of the floating gate 54. It will be appreciated that this symbol is used to designate the invented cell even where the configuration of the gates is not precisely as shown in FIG. 4. For example, the symbol of FIG. 4 more closely resembles the gate configuration of FIG. 1, however, the symbol of FIG. 4 represents both the configuration of gates shown in FIG. 1 and the configuration of gates shown in FIG. 3, in addition to other possible configuration of the gates.

Figure 5:
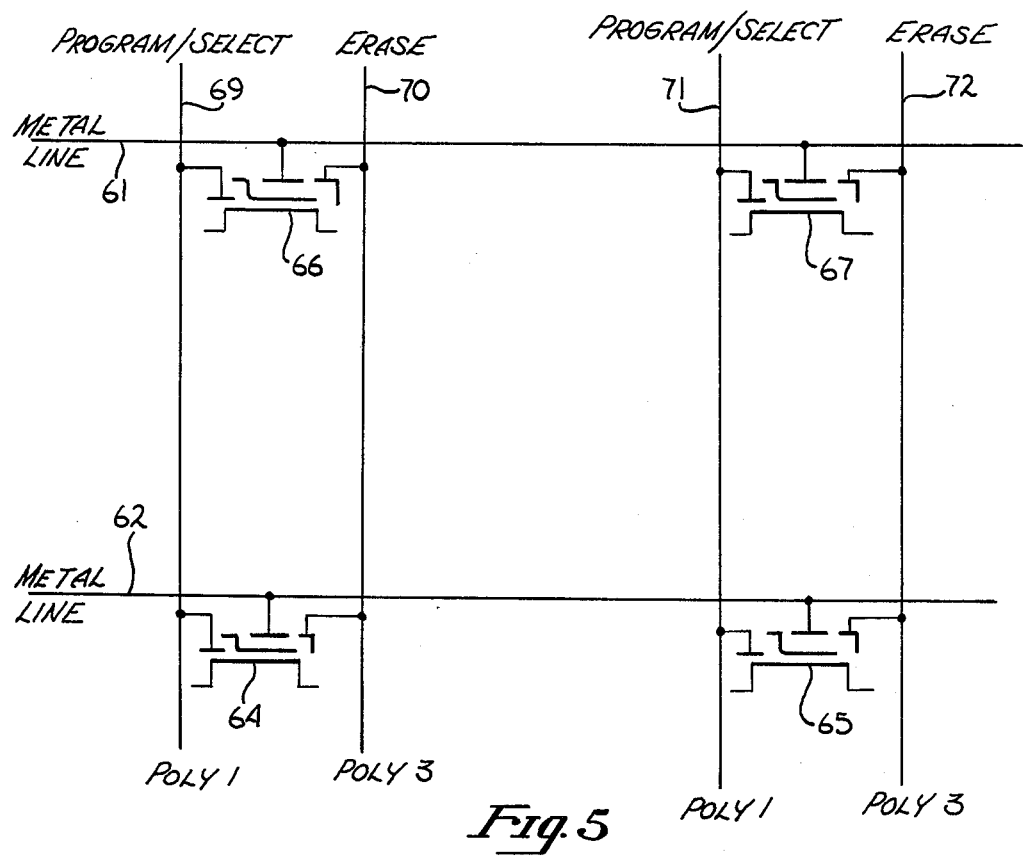
FIG. 5 illustrates a plurality of the devices of the present invention in a memory array.

Referring now to FIG. 5, a portion of an array is shown which includes four of the invented cells each depicted with the symbol of FIG. 4. The coupling of the gates for these devices with program/select lines, erase lines and one of the metal lines is shown in the partial array of FIG. 5. The coupling for the source and drain regions is not illustrated to simplify the drawing. The drain regions are coupled to metal lines disposed parallel to lines 61 and 62, while the source regions are common with elongated diffusions in the substate disposed generally transverse to the metal lines (such as line 35 of FIG. 2).

The cell 64 has its program/select gate coupled to line 69, its control gate coupled to the metal line 62 and its erase gate coupled to the erase line 70. Similarly, the cell 65 has its program/select gate coupled to line 71, its control gate coupled to the metal line 62, and its erase gate coupled to the line 72. The other two remaining cells 66 and 67 are coupled to their respective lines including the metal lines 61, in a similar manner.

The following table shows the potentials which are applied to the various lines in the array of FIG. 5 in order to program and erase cell 64. In the following table, the potential applied to the metal lines 61 and 62 (which are coupled to the control gates) are under the columns "C". The program/select lines 69 and 71 are coupled to the potentials shown under the column heading "P/S". Similarly, the erase gate voltage is shown under the column heading "E".

|  | CELL 64 | | | CELL 65 | | | CELL 66 | | | CELL 67 | | |
| --- | --- | --- | --- | --- | --- | --- | --- | --- | --- | --- | --- | --- |
|  | C | P/S | E | C | P/S | E | C | P/S | E | C | P/S | E |
| TO PROGRAM CELL 64 | 25 | 0 | 0 | 25 | 25 | 0 | 0 | 0 | 0 | 0 | 25 | 0 |
| TO ERASE CELL 64 | 0 | 0 | 25 | 0 | 25 | 0 | 25 | 25 | 25 | 25 | 25 | 0 |

Examining the gates for each of the cells 65, 66 and 67, both during the programming and erasing of cell 64 reveals that these other cells are neither programmed nor erased. For example, during the programming of cell 64, the control gate and program/select gate of cell 65 are at 25 volts while its erase gate is at 0 volts. For these conditions the floating gate of cell 65 will be at a potential close to 25 volts. Upon first examining this cell it might appear that electrons will be tunneled from the erase gate to the floating gate of this cell. However, it should be noted that the erase gate is fabricated from the third layer of polysilicon and hence does not have a rough texture. For this reason there is no enhanced electric field which would cause electrons to flow from the erase gate of cell 65 to its floating gate. Similarly, when cell 64 is erased, the floating gate of cell 67 will be neither charged or erased.

During the erasing of cell 64, the control gate of cell 65 and the erase gate of cell 65 are at 0 volts while the program/select gate is at 25 volts. This will cause the floating gate to be close to ground potential. Again on first examination it would appear that since the floating gate is close to 0 potential that electrons will flow to the program/select gate since it is at 25 volts. This does not occur since the lower surface of the floating gate is relatively smooth and does not provide the enhanced electric field required to initiate the tunneling through the approximately 1,000A of oxide separating these members. For the same reasons during the programming of cell 64, the state of cell 67 remains unchanged.

During the programming and erasing of cell 64 all the gates of cell 66 are either at 0 potential or at 25 volts, thus the state of cell 66 remains unchanged.

As with other floating gate devices, the presence of charge on the floating gate may be readily detected since there is a substantial shift in the threshold voltage of the device for the program state as compared to the unprogrammed state. Moreover, because of the program/select gate, cells may be readily accessed. For example, by the application of potentials to lines 61 and 69, cell 66 is accessed and the state of its floating gate may be readily determined between its source and drain terminals.

Thus, a floating gate device has been described which is fabricated from three separate layers of polysilicon. The layers are separated, one from the other, by relatively thick oxides of approximately 1,000A. Tunneling is employed as the mechanism for transporting the charge to and from the floating gate. Rough surfaces on the floating gate and the program/select gate provide enhanced electric fields which permit tunneling through the relatively thick oxide at moderate voltages.

I claim:

1. An MOS cell fabricated on a silicon substrate having three layers of polysilicon comprising:
    a first gate insulated from said substrate;
    a second gate comprising an electrically isolated floating gate, insulated from said substrate and from said first gate, said second gate overlapping at least a portion of said first gate;
    a third gate insulated from said substrate, from said first gate and from said second gate; said third gate overlapping at least a portion of said second gate; and,
    a fourth gate insulated from said substrate, from said first gate, from said second gate and from said third gate, said fourth gate overlapping at least a portion of said second gate;
    whereby by the application of a potential between said first gate and said third gate, charge may be tunneled into said floating gate, and by the application of a potential between said third gate and said fourth gate, charge may be tunneled into said third gate from said second gate.

2. The MOS cell defined by claim 1 wherein said first gate is formed as part of a first layer of polysilicon, said second gate is formed as part of a second layer of polysilicon, and said third gate is formed as part of a third layer of polysilicon.

3. The cell defined by claim 2 wherein said first, second, third and fourth gates are insulated, one from the other, by at least 1,000A of silicon oxide.

4. The device defined by claim 3 wherein said first and said second gates include rough surfaces with radii of curvature between 25A and 75A, said surface providing an enhanced electric field such that electrons may be tunneled through said silicon oxide at a lower voltage than would otherwise be required.

5. The cell defined by claim 4 wherein the capacitive coupling between said second and third gates is substantially greater than the capacitive coupling between said first and second gates or between said second and fourth gates.

6. The cell defined by claim 2 wherein said first gate and said fourth gate are formed by an elongated first polysilicon line and an elongated second polysilicon line, respectively.

7. The cell defined by claim 6 wherein said floating gate includes a first portion which extends over a channel region defined between a source region and a drain region, and a second portion which extends over said first polysilicon line and under said second polysilicon line.

8. A floating gate memory device comprising:
    a polysilicon floating gate having surface undulations with radii of curvatures between 25A and 75A;
    a polysilicon control gate insulated from said floating gate, said floating gate and control gate overlapping one another;
    a polysilicon programming gate, said programming gate having surface undulations with radii of curvature between 25A and 75A, said programming gate insulated from said floating gate and from said control gate, said floating gate and programming gate overlapping one another;
    a polysilicon erase gate insulated from said floating gate, from said control gate, and from said programming gate, said floating gate and said control gate overlapping one another;
    whereby, by the application of a potential between said programming gate and said control gate, charge may be tunneled into said floating gate and by the application of a potential between said control gate and said erase gate, charge may be tunneled into said erase gate from said floating gate.

9. The device defined by claim 8 wherein said gates are each separated, one from the other, by at least 1,000A of oxide.

10. The device defined by claim 8 wherein the capacitive coupling between said control gate and said floating gate is substantially greater than the capacitive coupling between said floating gate and said erase gate or between said floating gate and said programming gate.

11. The device defined by claim 8 wherein said programming gate and said erase gate are defined by elongated strips of polysilicon.

12. The device defined by claim 8 wherein said programming gate is fabricated from a first layer of polysilicon, said floating gate from a second layer of polysilicon, and said third gate and said erase gate from a third layer of polysilicon.

* * * * *

UNITED STATES PATENT AND TRADEMARK OFFICE
CERTIFICATE OF CORRECTION

PATENT NO. : 4,099,196
DATED : July 4, 1978
INVENTOR(S) : Richard T. Simko

It is certified that error appears in the above-identified patent and that said Letters Patent are hereby corrected as shown below:

| COLUMN | LINE | DESCRIPTION |
|---|---|---|
| 1 | 33 | After "Patent No.", delete "3,966,657" and insert in lieu thereof --3,996,657--. |
| 4 | 42 | Delete the word "charge" and insert in lieu thereof the word --charged--. |
| 6 | 22 | Delete the word "substate" and insert in lieu thereof the word --substrate--. |

Signed and Sealed this

Eleventh Day of September 1979

[SEAL]

Attest:

LUTRELLE F. PARKER

*Attesting Officer*   *Acting Commissioner of Patents and Trademarks*